(12) United States Patent
Dimri et al.

(10) Patent No.: US 12,211,850 B2
(45) Date of Patent: Jan. 28, 2025

(54) CELL ARCHITECTURE WITH EXTENDED TRANSISTOR GEOMETRY

(71) Applicant: Texas Instruments Incorporated, Dallas, TX (US)

(72) Inventors: Rakesh Dimri, Bengaluru (IN); Badarish Mohan Subbannavar, Bengaluru (IN); Somasekar J, Bengaluru (IN)

(73) Assignee: Texas Instruments Incorporated, Dallas, TX (US)

(*) Notice: Subject to any disclaimer, the term of this patent is extended or adjusted under 35 U.S.C. 154(b) by 12 days.

(21) Appl. No.: 17/514,580

(22) Filed: Oct. 29, 2021

(65) Prior Publication Data

US 2023/0140528 A1    May 4, 2023

(51) Int. Cl.
*H01L 27/118*    (2006.01)

(52) U.S. Cl.
CPC .............. *H01L 27/11807* (2013.01); *H01L 2027/11824* (2013.01); *H01L 2027/11881* (2013.01)

(58) Field of Classification Search
CPC ..... H01L 27/11807; H01L 2027/11824; H01L 2027/11881
USPC ....................................................... 257/207
See application file for complete search history.

(56) References Cited

U.S. PATENT DOCUMENTS

| 2005/0179061 A1* | 8/2005 | Jang | H01L 27/1214 257/E27.111 |
| 2009/0212327 A1* | 8/2009 | Kim | H01L 27/11807 257/E25.01 |
| 2014/0264924 A1* | 9/2014 | Yu | H01L 27/0207 438/622 |

FOREIGN PATENT DOCUMENTS

JP    2011049477    *    3/2011

* cited by examiner

*Primary Examiner* — Sheng-Bai Zhu
(74) *Attorney, Agent, or Firm* — Andrew R. Ralston; Frank D. Cimino

(57) ABSTRACT

An IC includes first-third power rails over a semiconductor substrate. The first rail has a first polarity different from the second and third rails. The IC includes multiple first cells on the semiconductor substrate in first and second rows. The first row is separated from the second row by the first power rail. Each first cell includes a first height and a first structure having at least one transistor. For each first cell in the first row, the first structure is entirely between the first and second rails. Further, for each first cell in the second row, the first structure is between the first and third rails. The IC includes an extension cell arranged on the semiconductor substrate in the first row. The extension cell includes a second structure having at least one transistor. A portion of the second structure extends into the second row.

13 Claims, 6 Drawing Sheets

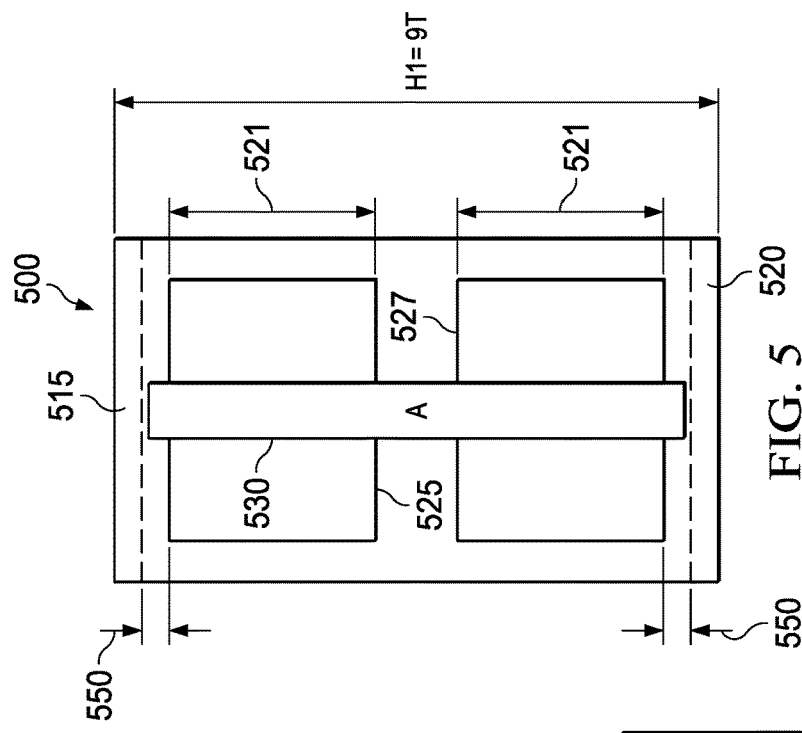
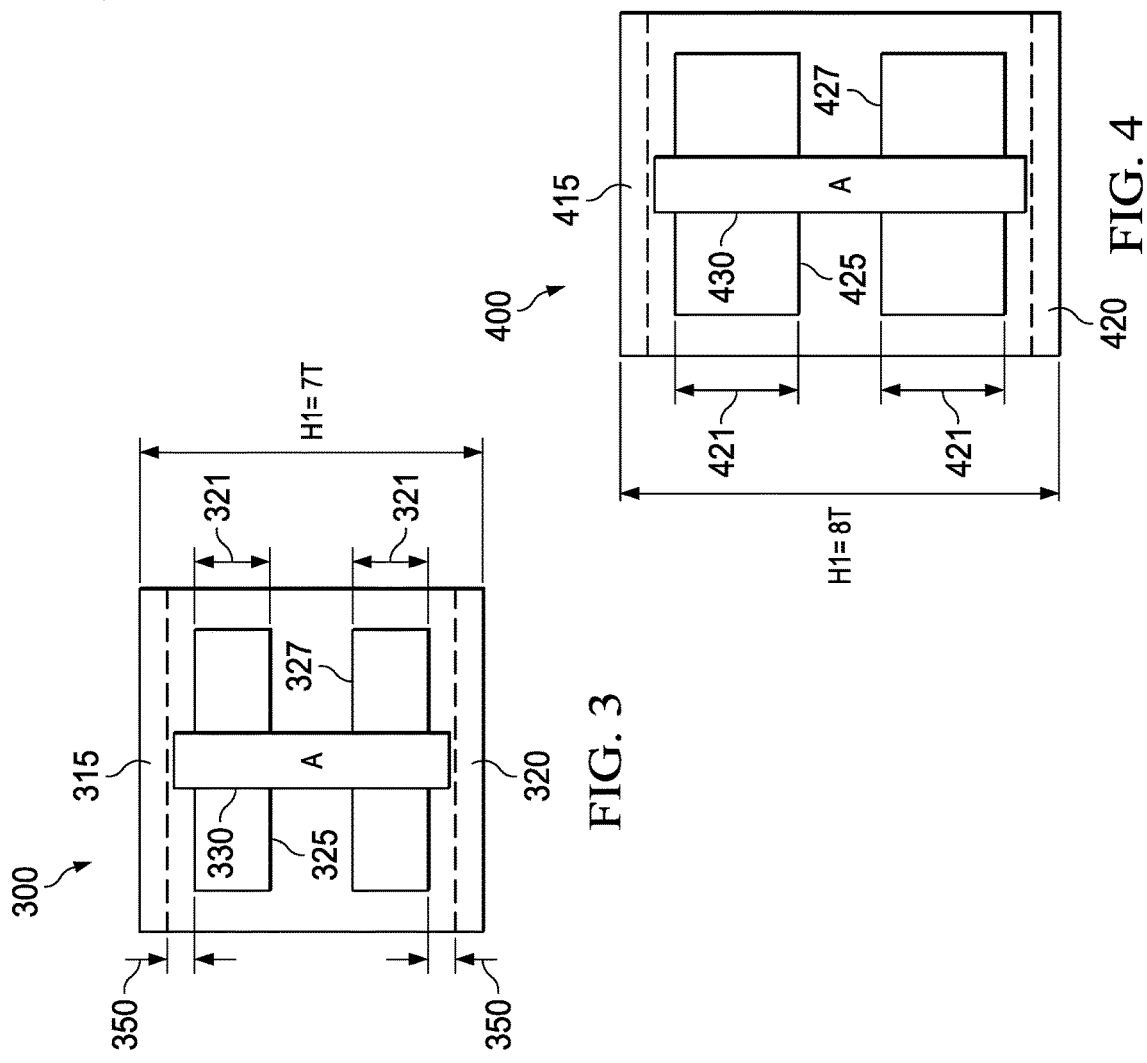
FIG. 3
FIG. 4
FIG. 5

CELL ARCHITECTURE WITH EXTENDED TRANSISTOR GEOMETRY

CROSS-REFERENCE TO RELATED APPLICATIONS

This application is related to U.S. patent application Ser. No. 17/463,115, filed Aug. 31, 2021, and to U.S. patent application Ser. No. 17/514,856 filed on even date herewith; each of which is incorporated herein by reference in its entirety.

BACKGROUND

Software tools are available that, based on a higher-level digital design, select logic cells to convert the higher-level digital design into a lower-level, transistor-level implementation. Logic cells include transistors configured to perform logic functions such as inverters, NAND gates, NOR gates, etc. The transistors of logic cells perform the logic functions at a particular output drive current capacity. Some logic cells are capable of higher output drive current than other cells. A higher output drive current logic cell is generally a higher performance logic cell than a lower output drive current logic cell. An example of performance includes the propagation delay through the cell. A higher performance logic cell has a lower propagation delay through the cell than a lower performance logic cell. Any given logic function (NAND, NOR, etc.) may have multiple performance logic cells for that particular logic function to accommodate the varying needs of the application. Conventionally, logic cells in a digital library have a standard height with varying widths. Different digital libraries may be available with each respective digital library comprising logic cells of a given height. The logic cells of one library are typically selected to implement a given circuit design. That is, multiple logic cell libraries are typically not used to implement a single circuit design.

SUMMARY

In one example, an integrated circuit (IC) includes first, second, and third power rails located over a semiconductor substrate. The first power rail is configured to have a first polarity and the second and third power rails configured to have a different second polarity. The IC also includes a plurality of first logic cells arranged over the semiconductor substrate in first and second rows. The first row is separated from the second row by the first power rail. Each of the plurality of first logic cells includes a first height and a first semiconductor structure having at least one transistor and interconnections. For each first logic cell in the first row, the first semiconductor structure is located entirely between the first and second power rails. Further, for each first logic cell in the second row, the first semiconductor structure is located entirely between the first and third power rails. The IC also includes an extension logic cell arranged over the semiconductor substrate in the first row. The extension logic cell includes a second height that is greater than the first height. The extension logic cell also includes a second semiconductor structure having at least one transistor and interconnections. The second semiconductor structure is configured to implement at least a second logic function. Further, at least a portion of the second semiconductor structure extends into the second row.

In another example, a method of forming an IC includes forming first, second and third power rails over a semiconductor substrate. The first power rail is configured to have a first polarity and the second and third power rails configured to have a different second polarity. The method further includes forming a plurality of first logic cells over the semiconductor substrate in first and second rows. The first row is separated from the second row by the first power rail. Each of the plurality of first logic cells includes a first height and a first semiconductor structure comprising at least one transistor and interconnections. For each first logic cell in the first row, the first semiconductor structure is located entirely between the first and second power rails, and, for each first logic cell in the second row, the first semiconductor structure is located entirely between the first and third power rails. The method also includes forming an extension logic cell over the semiconductor substrate in the first row. The extension logic cell includes a second height that is greater than the first height. The extension logic cell also includes a second semiconductor structure having at least one transistor and interconnections. The second semiconductor structure is configured to implement at least a second logic function. At least a portion of the second semiconductor structure extends into the second row.

BRIEF DESCRIPTION OF THE DRAWINGS

For a detailed description of various examples, reference will now be made to the accompanying drawings in which:

FIG. 3 is a 7T height logic cell in accordance with an example.

FIG. 4 is an 8T height logic cell in accordance with an example.

FIG. 5 is a 9T height logic cell in accordance with an example.

The same reference number is used in the drawings for the same or similar (either by function and/or structure) features.

DETAILED DESCRIPTION

Figure 1:
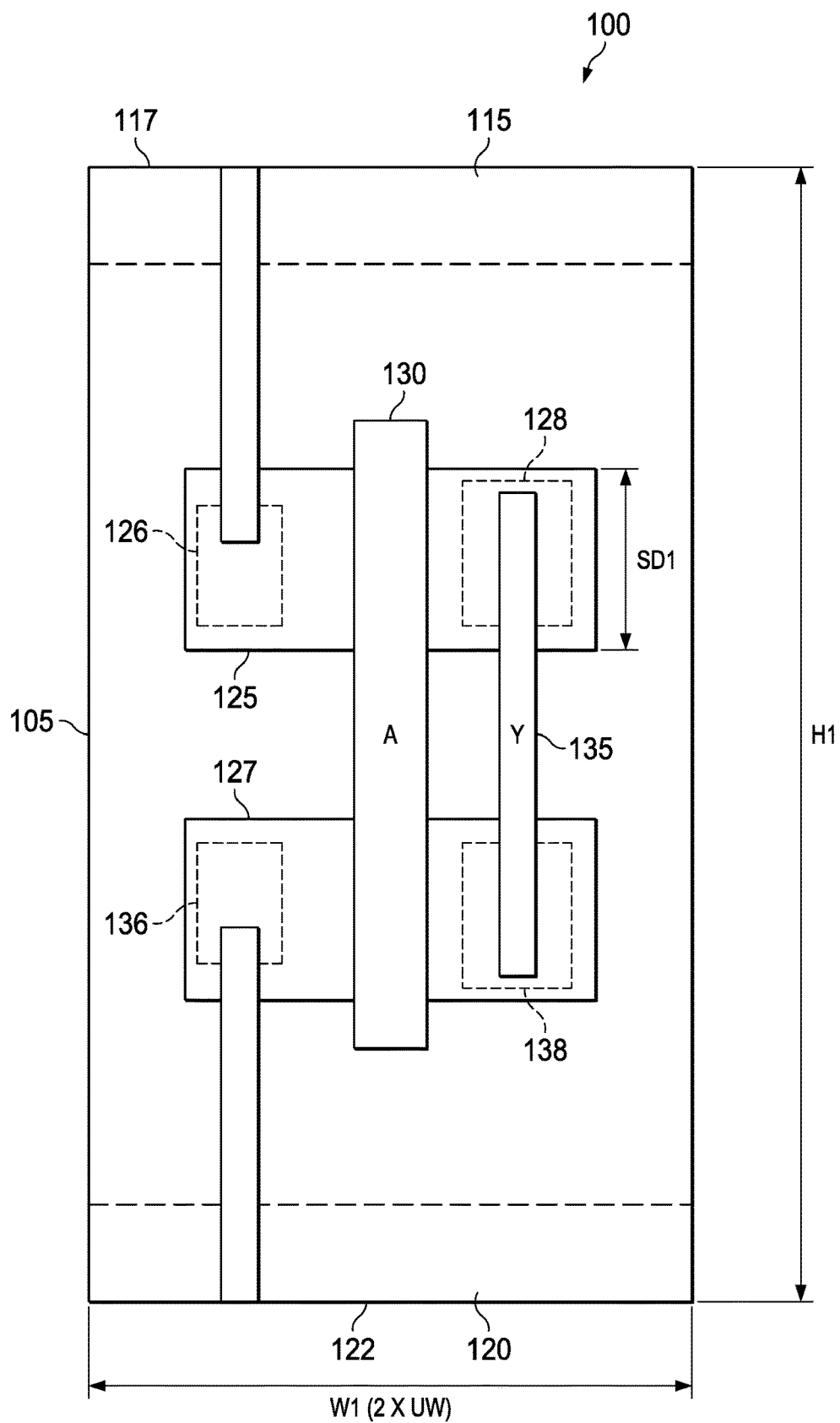
FIG. 1 is a plan view of a logic cell in accordance with an example.

As explained above, each digital library has logic cells of a given height and corresponding performance. The applicable unit dimension of cell height may be referred to as "track" (T), "pitch," "grid," and the like. Cell height of a given library is referred to as multiples of T. The height of cells in one library, for example, may be 7T (seven times the track, T, dimension). Cell libraries thus may include nT cells, where "n" is greater than or equal to 1 (e.g., 5T cells, 6T cells, 7T cells, 8T cells, 9T cells, etc.). In some cases, n is an integer, but can be other than an integer in other cases (e.g., 6.5T, 7.5T, etc.) A 9T cell may have transistors with a larger channel width (W) than an 8T cell, and an 8T cell may have transistors with a larger W than a 7T cell. Accordingly, a 9T cell is typically a higher performance cell than an 8T cell, and an 8T cell is typically a higher performance cell than a 7T cell. A higher performance cell, however, occupies a larger area than does a lower performance cell.

Any given design generally includes multiple logic cells, including multiple instances of logic cells that implement a same logic function, and instances of logic cells that implement different logic functions. Due to timing constraints, some logic cells may need to be of a higher performance (e.g., lower propagation delay) than other logic cells. For example, 20% of the cells of a design may need to be 9T cells, while the remaining 80% of the cells need not be implemented as 9T cells and can be implemented as 7T cells. However, some place and route software tools only use cells of a same height to implement a circuit. Accordingly, the digital library to source the cells for the design may be the library comprising the highest needed performance cells of the design. In the example above, all of the cells may be implemented using the 9T cell library although only 20% of the cells actually need the performance capability afforded by the 9T cells. The cells that do not need 9T performance are nevertheless implemented using 9T cells, which also means those cells have an area that is larger than necessary (compared to what would have been the case if 7T cells could have been used). Area is thus wasted on higher performance cells when such performance is not needed for many of the cells in the design.

The embodiments described herein are directed to an integrated circuit that includes multiple logic cells arranged in rows on a substrate. A first row includes a first logic cell. A second row includes an extension logic cell. One or more transistors in the first logic cell may have a drive strength that is smaller than the minimum drive strength of the one or more transistors in the extension logic cell. At least a portion of a semiconductor structure forming the extension logic cell extends into an unused area of the first logic cell in the adjacent row, and one or more transistors in the extension logic cell may have a drive strength that is greater than a maximum drive strength of the one or more transistors in the first logic cell. The first logic cell has a low enough drive strength that its semiconductor structure is small enough to result in an unused area within the first logic cell into which the semiconductor structure of the adjacent extension logic cell can extend.

FIG. 1 is a plan view of an example logic cell 100 of an integrated circuit (100). The example logic cell 100 has two transistors. The logic cell 100 has a width W1 and a height H1. The width W1 may vary from logic cell to logic cell within a given logic cell library. A "unit width" (UW) defines a standard width measurement of, for example, 0.5 micrometers (microns). The unit width may be a width of a line pitch value at an interconnect metal level, e.g. metal 2. In the example of FIG. 1, the width W1 of logic cell 100 is double the unit width (2×UW) and accordingly W1 is 1.0 microns (in the example in which UW is 0.5 microns). The height H1 is a fixed value for the logic cells of a given library. For example, the cells of one particular library may have H1 that is 7T. For the cells of another library, however, H1 may be 8T. In general, the height of the cells of a library is nT, where n is an integer greater than or equal to 1. For example, 5T, 6T, 7T, 8T, and 9T cell libraries are available. In one example, "T" is 0.5 microns, which may also be a line pitch value of an interconnect metal level. The cells of a given library all have the same height, but the width of the cells of a given library may vary from cell to cell.

Figure 2:
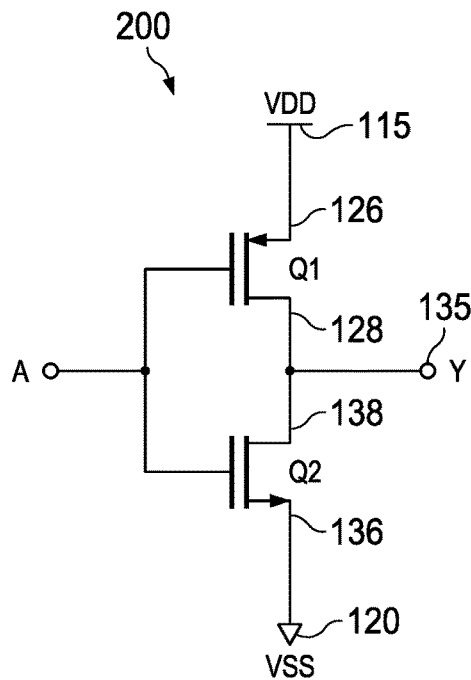
FIG. 2 is a circuit schematic of the logic cell of FIG. 1.

The transistors of the example logic cell 100 of FIG. 1 are configured as an inverter, which is shown schematically in FIG. 2, at least some components of which are also identified in FIG. 1. The inverter 200 includes a P-type metal-oxide semiconductor field effect transistor (PMOS transistor) Q1 and an N-type metal-oxide semiconductor field effect transistor (NMOS transistor) Q2 as well as interconnections (e.g., metal connections between components). Transistor Q1 has a source 126 and a drain 128. Transistor Q2 has a source 136 and a drain 138. The source 126 of transistor Q1 is coupled to a first power rail (e.g., a non-zero supply voltage, VDD) by a trace 115, and the source 136 of transistor Q2 is coupled a second power rail (e.g., ground (VSS)) by a trace 120. While shown in a polysilicon level, the traces 115, 120 may be in any interconnect level. While not explicitly shown, the power rails 115, 120 may be located in a metal layer above the low-drive logic cell 100 such that the side 117 is at about parallel to and at a midpoint of the power rail 115 and the side 122 is at about parallel to and at a midpoint of the power rail 120. The drains 128 and 138 of transistors Q1 and Q2 are coupled together at an output node Y (labeled 135). A polysilicon (or other suitable material) trace 130 acts as the gate of the transistors Q1 and Q2 and a local interconnect between the gates, and is an input node A of the logic cell 100. The signal on the output node Y is the logical inverse of the signal on the input node A, Y=$\overline{A}$. For example, the signal on the output node Y is a logic high responsive to the signal on the input node A being logic low, and vice versa. While the logic cell examples provided in this discussion refer to the function as inversion, the function provided by the logic cells is no limited to any particular functions, which may include, e.g. NOR or NAND gates, or more complex functions such as flip-flops.

Referring again to FIG. 1, the logic cell 100 includes the power rails 115 and 120 along the logic cell's opposing sides 117 and 122, respectively, spaced apart along the longitudinal axis by the height H1. Power rail 115 (configured to receive VDD) is alongside 117, and power rail 120 (configured to receive VSS) is along the opposing side 122. The low-drive logic cell 100 includes a first transistor source-drain region 125, and a second transistor source-drain region 127. Source-drain region 125 includes the source 126 and the drain 128 of PMOS transistor Q1. Similarly, source-drain region 127 includes the source 136 and the drain 138 of NMOS transistor Q2. The gates of transistors Q1 and Q2 are coupled together by a trace that which may comprise a polysilicon or other suitable material and provides the node A.

FIGS. 3-5 are plan views of a 7T digital cell 300, an 8T digital cell 400, and a 9T digital cell 500, respectively. Digital cells 300, 400, and 500 generally have the same configuration as that of digital cell 100 of FIG. 1 (two transistors which form an inverter). Some of the components of cell architecture shown in FIG. 1 are omitted from FIGS. 3-5 for simplicity. Digital cell 300 has source-drain regions 325 and 327 and a gate 330. Overlying VDD and ground power rails for logic cell 300 are identified by reference numerals 315 and 320, respectively. Reference numeral 350 defines the distance between the source-drain regions 325, 327 and the power rails 315 and 320 as shown. Digital cell 400 has source-drain regions 425 and 427 and a gate 430. The VDD and ground power rails for logic cell 400 are identified by reference numerals 415 and 420, respectively. Digital cell 500 has source-drain regions 525 and 527 and a gate 530. The VDD and ground power rails for logic cell 500 are identified by reference numerals 515 and 520, respectively, and reference numeral 550 defines the distance between the source-drain regions 525, 527 and the power rails 515 and 520.

The width of source-drain regions 325 and 327 of logic cell 300 is identified by reference numeral 321. In some embodiments, the width of the source-drain region 325 is the same as for source-drain region 327, but in other embodiments the widths can be different. The width of source-drain regions 425 and 427 of logic cell 400 is identified by reference numeral 421. The width of source-drain regions 525 and 527 of logic cell 500 is identified by reference numeral 521. The width 521 of source-drain regions 525 and 527 of logic cell 500 is larger than the width 421 of source-drain regions 425 and 427 of logic cell 400. The width 421 of source-drain regions 425 and 427 of logic cell 400 is larger than the width 321 of source-drain regions 325 and 327 of logic cell 300. Accordingly, during saturation and for similar gate-to-source voltages, the drain current capacity of logic cell 500 is larger than that of logic cells 300 or 400, and the drain current capacity of logic cell 400 is larger than that of logic cell 300. In turn, this means that the performance of logic cell 500 is greater than that of logic cell 400, and the performance of logic cell 400 is greater than that of logic cell 300. Logic cell 500 has a higher performance than logic cells 300 and 400, but logic cell 500 occupies more area than logic cells 300 or 400. Logic cell 300 has the lowest performance from among cells 300, 400, and 500 but also occupies the smallest area. A trade-off thus exists between size and performance—smaller size results in lower performance but smaller die size, and higher performance but higher die size.

Figure 6:
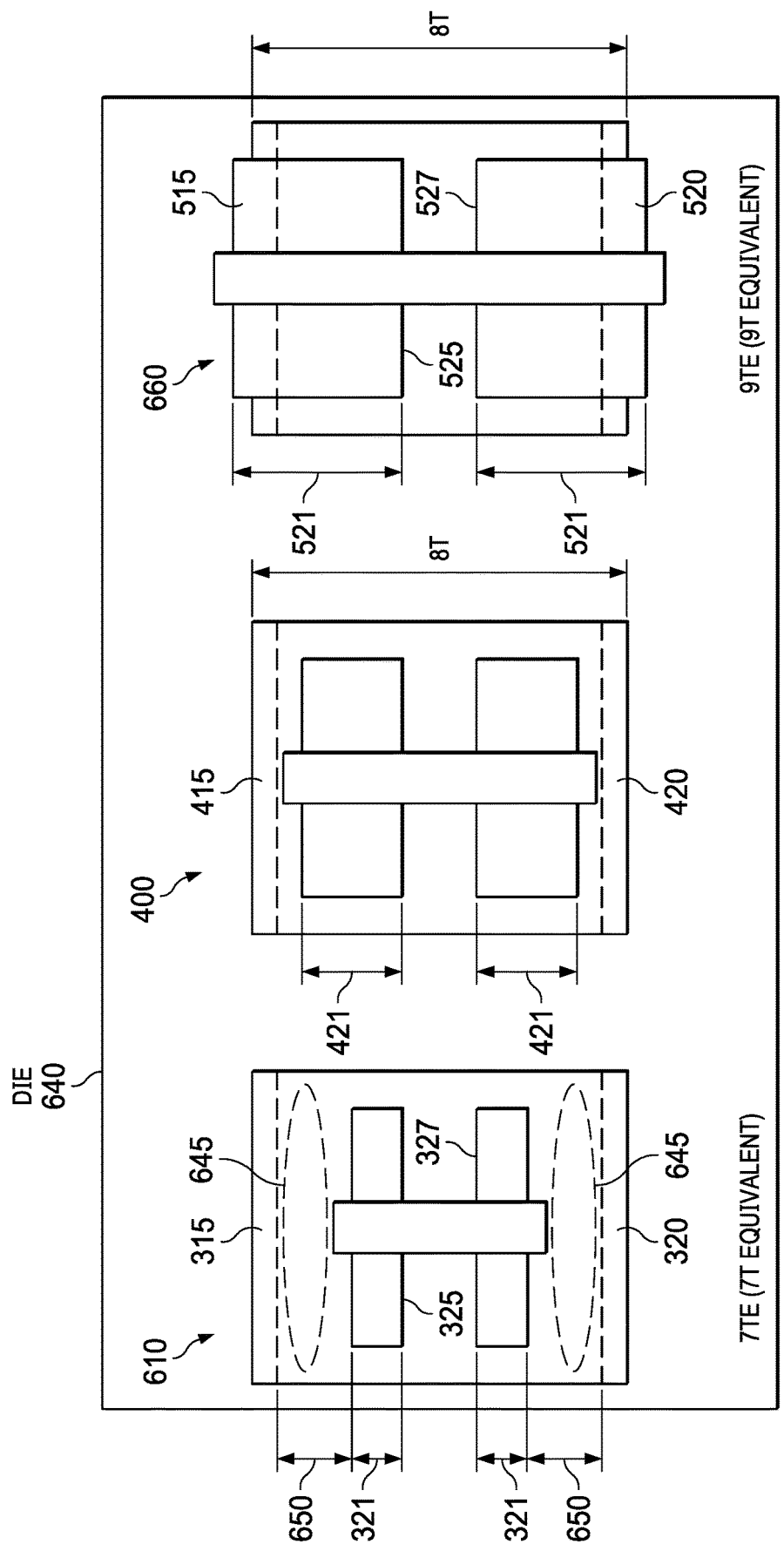
FIG. 6 is a layout of a die including multiple logic cells in accordance with an example.

As described above, if at least some of the cells of a given design require the performance of the larger, higher performance logic cells (e.g., 9T cells versus smaller 8T or 7T cells), then all cells in the design are typically implemented with the same size, higher performance cells, resulting in a larger area of the design than would otherwise be needed if smaller, lower drive logic cells were used. FIG. 6 shows an embodiment in which three logic cells 610, 400, and 660 are provided on a semiconductor die 640. In general, the die 640 can include any number of logic cells other than three (two or four or more). Logic cells 610, 400, and 660 have the same height (8T in this example).

In this embodiment, logic cell 400 is as described above. Logic cell 400 is an 8T logic cell whose transistor channel widths are the same as shown in FIG. 4 (reference numerals 421 illustrate the channel widths). Logic cell 400 has the performance of an 8T logic cell as a result of, at least in part, channel widths 421.

Logic cell 610 implements a same or different logic function than logic cell 400 and has at least two transistors, at least some of which have channel widths 321 that are the same as the channel widths of the 7T logic cell 300 of FIG. 3. Further, for logic cell 610, the spacing 650 between the source-drain regions 325, 327 and the respective power rails 315 and 320 is larger than the spacing 350 of the 7T logic cell 300 of FIG. 3. Functionally, logic cell 610 has the performance of a 7T logic cell, but with an 8T height. The larger 8T height results from the larger spacing between the power rails and the source-drain regions, which results in "empty areas" 645. Accordingly, logic cell 610 may be referred to as a "7T equivalent" (7TE) logic cell meaning that it has the performance equivalent of a 7T cell but with a larger height than a conventional 7T logic cell 300.

Logic cell 660 also has at least two transistors, at least some of which have channel widths 521 that are consistent with the 9T logic cell 500 of FIG. 5. Functionally, logic cell 660 has the performance of a 9T logic cell, but with a smaller, 8T height. Accordingly, logic cell 610 may be referred to as a 9T equivalent (9TE) logic cell. The 8T height of the 9T-performance logic cell 660 is smaller than a conventional 9T logic cell 500 (FIG. 5). The smaller 8T height is achieved by repositioning the power rails 515 and 520 to at least partially overlay the source-drain regions 525 and 527 to thereby align with the corresponding power rails of logic cells 610 and 400. As a result, at least a portion of the source-drain regions 525 and 527 extend beyond the 8T height dimension.

Figure 7:
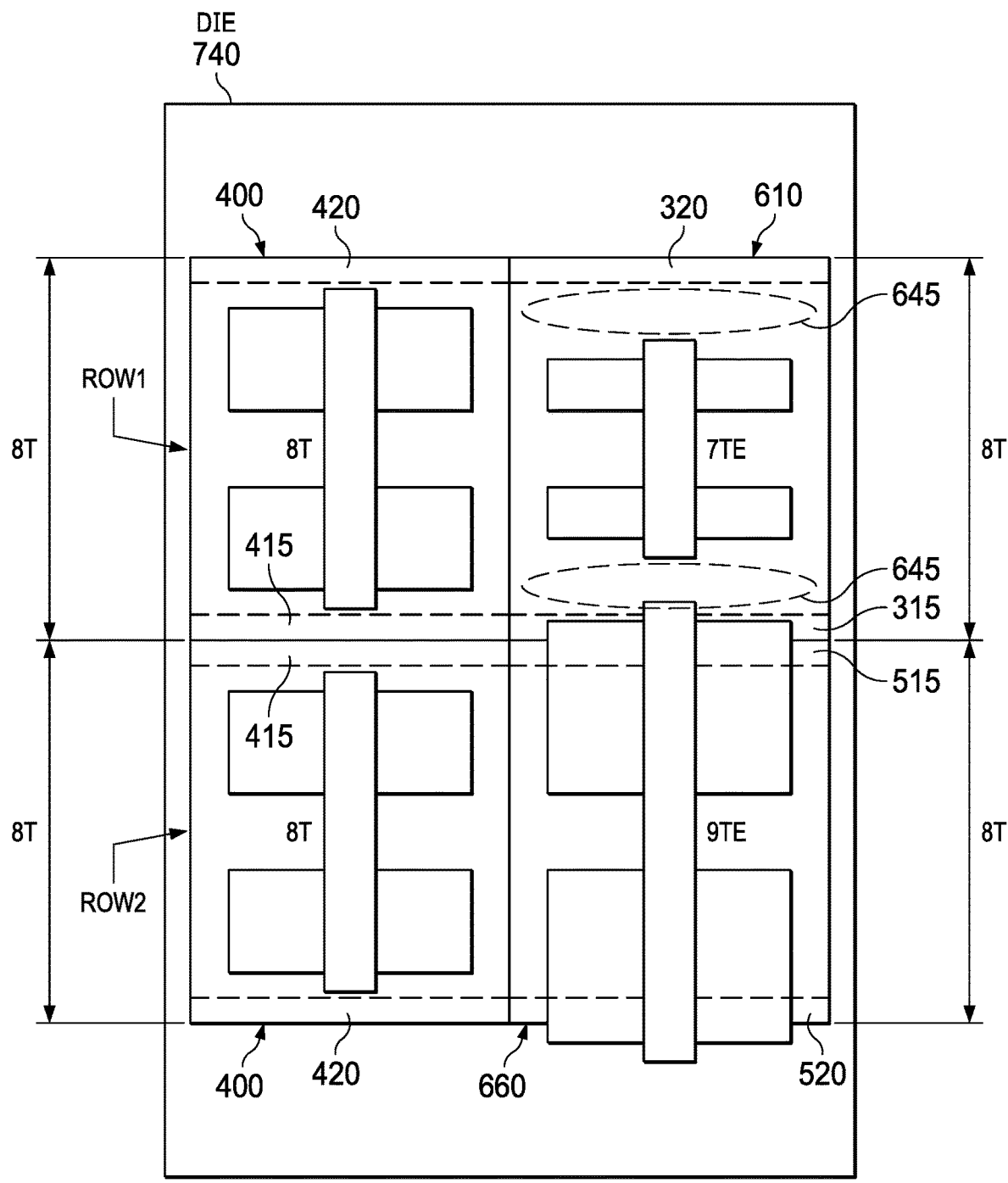
FIG. 7 is a layout of a die having multiple rows of logic cells for which at least one logic cell extends into an empty space of a neighboring logic cell in accordance with an example.

FIG. 7 shows a layout of logic cells on a die 740. The die 740 includes at least two rows (ROW1 and ROW2) of logic cells. More than two rows are possible in other embodiments. ROW1 includes logic cells 400 and 610. ROW2 includes logic cells 400 and 660. While two logic cells per row are shown in the embodiment of FIG. 7, any number of logic cells can be included in each row in other embodiments. Furthermore, each of the logic cells may have a same logic function or different logic function from others of the logic cells. A VDD power rail includes power rails 315, 415 and 515, a first ground power rail includes power rails 320 and 420 at the top of the figure, and a second ground power rail includes power rails 320 and 520 at the bottom of the figure. A centerline of the VDD power rail is spaced apart by 8T from each of the first and second ground power rails.

The part of 9TE logic cell 660 that extends outside the boundaries of the 8T logic cell height extends into the adjacent, lower empty space 645 of 7TE logic cell 610. Because the 7TE logic cell 610 has empty spaces 645, then wherever a 9TE logic cell 660 is to be included in a layout, a 7TE logic cell 610 may be included above and/or below the 9TE logic cell. The 8T logic cell 400 is not located above or below a 9TE logic cell 660 because logic cell 400 does not have sufficient empty space into which the upper or lower extension portions of the 9TE logic cell 660 can be extended. In some embodiments, a 6TE logic cell can be located above and/or below a 9TE (or 10TE) logic cell 660. A 6TE logic call has transistors with even narrower width channels (in an 8T height) and thus empty spaces that are even larger than empty spaces 645 of the 7TE logic cells. In some embodiments, for any mTE logic cell that extends over the cell boundary (e.g., a 9TE logic cell 660 in the example of FIG. 7), any nTE logic cell can be located above or below it as long as the following relationship between n and m is true:

$$n \leq m - 2 \qquad (1)$$

In the example of a 9TE logic cell 660 extending over the cell boundary, the upper or lower abutting cell could be any of a 7TE, 6TE, 5TE, etc. logic cell.

Figure 8:
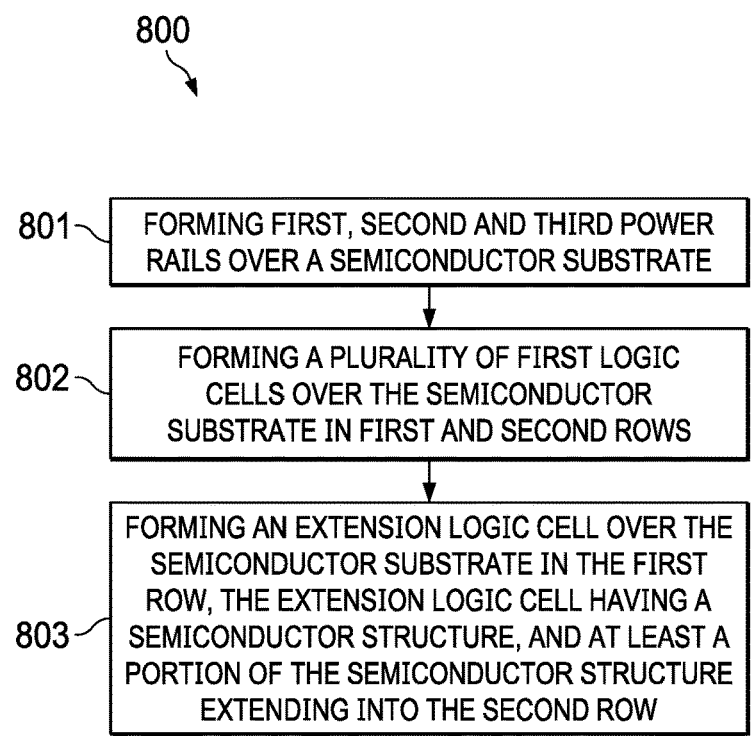
FIG. 8 is a flow chart depicting an example method of forming an integrated to include an extension logic cell in accordance with an example.

FIG. 8 is an example method 800 for forming an integrated circuit in accordance with the disclosed embodiments. At 801, the method includes forming first, second and third power rails over a semiconductor substrate. As explained above, the first power rail is configured to have a first polarity (e.g., VDD) and the second and third power rails are configured to have a different second polarity (e.g., ground, VSS).

At 802, the method further includes forming a plurality of first logic cells over the semiconductor substrate in first and second rows. The first row is separated from the second row by the first power rail. Each of the plurality of first logic cells includes a first height and a first semiconductor structure. The first semiconductor structure includes at least one transistor and interconnections to implement a logic function. Further, for each first logic cell in the first row, the first semiconductor structure is located entirely between the first and second power rails. For each at least two adjacent first logic cell in the second row, the first semiconductor structure is located entirely between the first and third power rails.

At 803, the method also includes forming an extension logic cell over the semiconductor substrate in the first row. The extension logic cell includes a second height that is greater than the first height. The extension logic cell also includes a second semiconductor structure having at least one transistor and interconnections. The second semiconductor structure is configured to implement at least a second logic function. Further, at least a portion of the second semiconductor structure extends into the second row.

Figure 9:
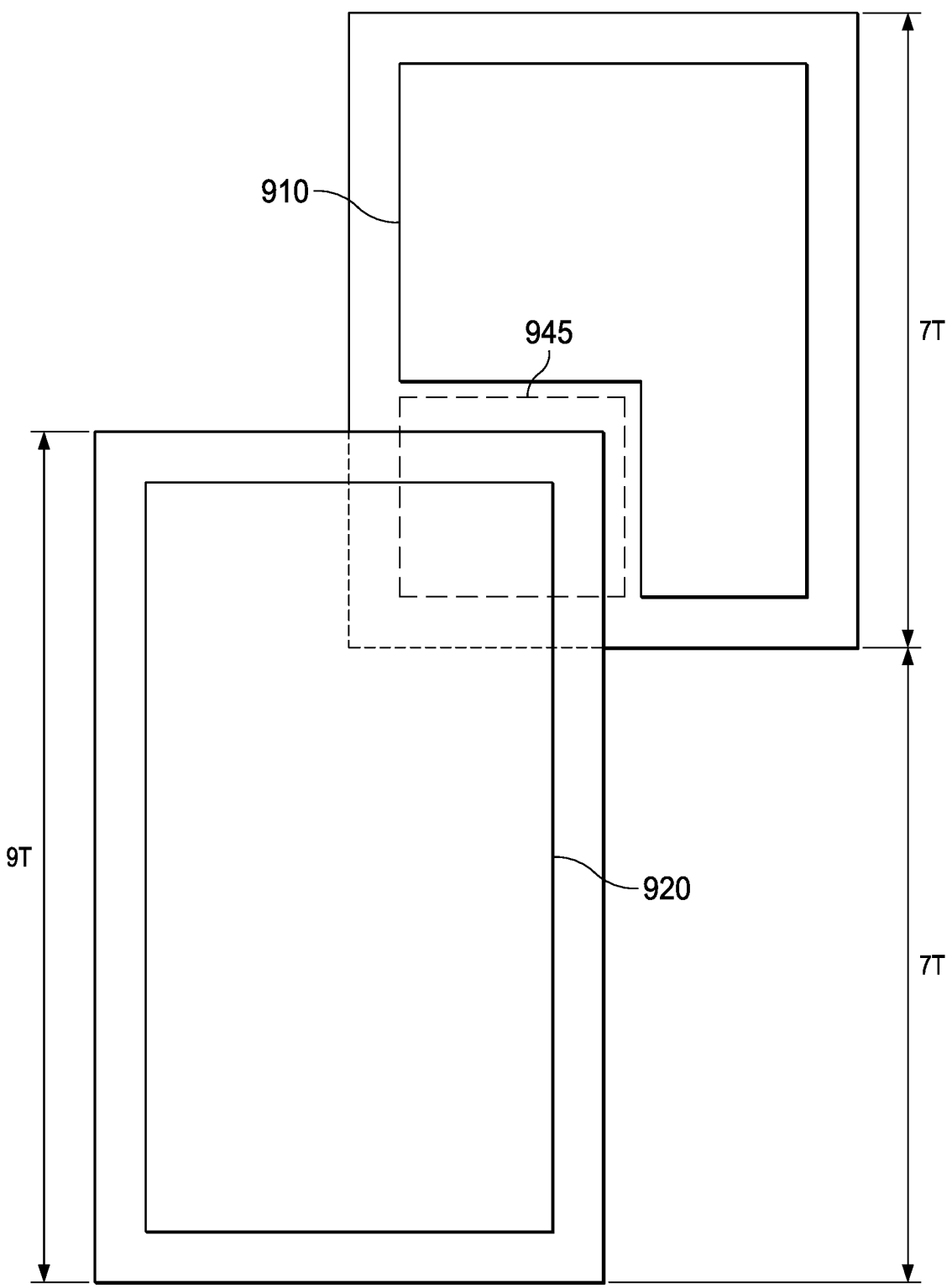
FIG. 9 is a layout of offsetting logic cells in accordance with an example.

In the embodiment of FIG. 7, the 7TE and 9TE logic cells 610 and 660 align horizontally and the empty pace 645 of the logic cell 610 is arranged laterally along the entire power rail 315 of the cell. FIG. 9 shows an embodiment in which the 7TE and 9TE cells are offset laterally. The semiconductor structure of the 7TE logic cell is identified at 910 and is L-shaped which provides a laterally smaller (but possibly vertically larger) empty space 945 into which the semiconductor structure 920 of the 9TE logic cell can extend.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon field effect transistor ("MOSFET") may be used in place of an n-type MOSFET with little or no changes to the circuit. Furthermore, other types of transistors may be used (such as bipolar junction transistors (BJTs)).

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

Modifications are possible in the described embodiments, and other embodiments are possible, within the scope of the claims.

What is claimed is:

1. An integrated circuit (IC), comprising:
first, second and third power rails located over a semiconductor substrate and having a respective first, second and third centerlines, the first power rail configured to have a first polarity and the second and third power rails configured to have a different second polarity;
a plurality of first logic cells arranged over the semiconductor substrate in first and second rows, the first centerline located between the first row and the second row, each of the plurality of first logic cells including and a corresponding semiconductor structure comprising at least one transistor and interconnections that implement a respective logic function, and
for each first logic cell in the first row, the corresponding semiconductor structure is located entirely between the first and second centerlines, and
for each first logic cell in the second row, the corresponding semiconductor structure is located entirely between the first and third centerlines; and
an extension logic cell arranged over the semiconductor substrate in the first row and including an extended semiconductor structure comprising at least one transistor with a source region and a drain region and interconnections, the extended semiconductor structure configured to implement at least a logic function, a portion of the source region or the drain region crossing the first centerline into the second row.

2. The IC of claim 1, in which:
the semiconductor structures of the first logic cells are configured to implement a first drive strength;
the extended semiconductor structure is configured to implement a second drive strength; and
the second drive strength is greater than the first drive strength.

3. The IC of claim 1, in which:
the semiconductor structure of at least a first one of the first logic cells is configured to implement a first drive strength;
the semiconductor structure of at least a second one of the first logic cells is configured to implement a second drive strength; and
the extended semiconductor structure is configured to implement a third drive strength;
wherein the third drive strength is greater than the second drive strength, and the second drive strength is greater than the first drive strength.

4. The IC of claim 1, wherein:
the semiconductor structures of the first logic cells are configured to implement a first drive strength; and
the portion of the extended semiconductor structure crossing the first centerline is configured to implement the first drive strength.

5. The IC of claim 1, in which the extension logic cell is laterally offset from a first instance of the first logic cell in the second row such that the first instance of the first logic cell is L-shaped.

6. The IC of claim 1, wherein the first power rail is spaced apart from the second and third power rails by a same distance.

7. The IC of claim 1, wherein a first instance of the first logic cells is configured to operate with a first drive current and the extension logic cell is configured to operate with a second greater drive current, and a second instance of the first logic cells is configured to implement a same logic function as the first instance and to operate with a third drive current between the first and second drive currents.

8. An integrated circuit (IC), comprising:
first, second and third power rails located over a semiconductor substrate, the first power rail configured to have a first voltage and the second and third power rails configured to have a different second voltage;

a first logic cell located between the first and second power rails and including a first logic structure formed in or over the semiconductor substrate and configured to implement a first logic function; and a second logic cell located between the first logic structure and the third power rail and including a second logic structure formed in or over the semiconductor substrate and configured to implement a second logic function, the second logic structure extending past the first power rail toward the first logic structure.

9. The IC of claim 8, wherein a transistor of the second logic structure extends past the first power rail toward the second power rail.

10. The IC of claim 9, wherein the transistor is a second transistor that is configured to have a second drive current that is greater than a first drive current of a first transistor in the first logic structure.

11. The IC of claim 8, wherein the first logic cell is one of a first plurality of logic cells located between the first and second power rails that are spaced along a first row at integer multiples of a unit width, and the second logic cell is one of a second plurality of logic cells located between the first and third power rails that are spaced along a second row at integer multiples of the unit width.

12. The IC of claim 8, wherein the first logic function is different from the second logic function.

13. The IC of claim 8, wherein the first logic cell is offset from the second logic cell in a direction along the first and second power rails.

* * * * *